April 1, 1958

J. KALISH 2,829,256

OSCILLATOR

Filed Nov. 6, 1956

Inventor
JOSEPH KALISH
By Bernard E. Franz
Attorney 2,829,256

OSCILLATOR

Joseph Kalish, New Milford, N. J., assignor to International Telephone and Telegraph Corporation, Nutley, N. J., a corporation of Maryland Application November 6, 1956, Serial No. 620,771

8 Claims. (Cl. 250—36)

This invention relates to an oscillator and more particularly to a circuit arrangement for producing alternating-current power at a useful output level, with a miniature low-frequency crystal in the frequency determining portion of the circuit.

Miniature crystals for low frequency have recently been developed which are desirable for applications such as in air-borne equipment. Since these crystals can tolerate only a very low dissipation, it has previously been found necessary to use an oscillator stage and a separate amplifier stage, with a coupling arrangement such as an RC filter between them. It is an object of this invention to provide a circuit arrangement using a single amplifying device, such as a triode vacuum tube, for the oscillator and the output amplifier, while obtaining good frequency stability and low distortion at a high output level.

To keep the crystal dissipation to the required low value, and to obtain the desired frequency stability and low distortion, it has been found necessary to limit the level of the signal supplied to the frequency-determining oscillation circuit which includes the crystal.

In one known circuit, the resistance-stabilized oscillator, a resistor is connected between the output terminal of the amplifying device and the oscillation circuit to limit the feedback signal to a value just sufficient to sustain oscillation.

It is well known that in the usual oscillators of the feedback type, oscillation occurs at a frequency at which there is a 360° phase shift around the loop comprising the amplifying device, the oscillation circuit, and connecting elements; with the amplifying device and the oscillation circuit each providing approximately 180° of the phase shift. However, in prior oscillators, including the resistance-stabilized type, the phase shift in the oscillation circuit deviates from the desired 180°, and therefore a compensating deviation is required in the amplifying device and other circuit elements. This compensating deviation, and therefore the frequency, is affected by the output load, the parameters of the amplifying device, and the values and characteristics of the other circuit elements. It is an object of this invention to provide a circuit arrangement in which the frequency is determined by the oscillation circuit only, and is independent of variations in the other circuit elements, supply voltages, and output characteristics.

According to the invention, a combined oscillator and amplifier using a single amplifying device is provided, in which the undesired phase shift is minimized by using an oscillation circuit of the Colpitts type. The crystal, operating in the parallel mode, forms the inductive branch and is in parallel with a capacitive branch including series condensers. Since no phase shift is required in the circuit which couples the output of the amplifying device to the oscillation circuit, the oscillation circuit may be isolated from the load impedance, which is coupled to the output terminal of the amplifying device, and the crystal dissipation may be kept low, by connecting a very high pure resistance in the feedback path between the output terminal and one end of the series condensers in the oscillation circuit. The input and reference terminals of the amplifying device are connected respectively to the other end and an intermediate point of the series condensers.

In the preferred form of the invention, a filter comprising a parallel inductor and capacitor, which need not be tuned to the exact output frequency, is connected in the output between the amplifying device and the load device. The amplifying device may be a triode vacuum tube.

The above-mentioned and other features and objects of this invention will become more apparent by reference to the following description taken in conjunction with the accompanying drawings, in which.

Figures 2, 3:
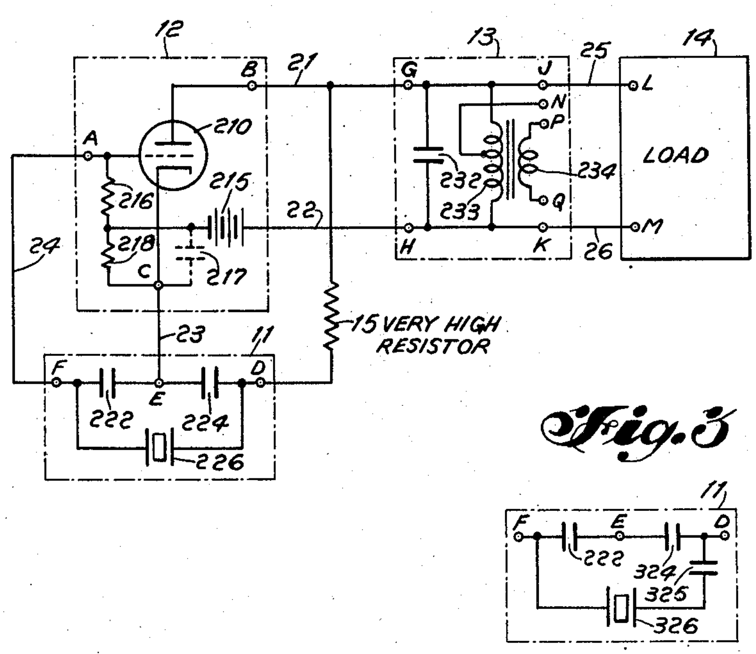
Fig. 2 shows circuit details of the system of Fig. 1.
Figure 4:
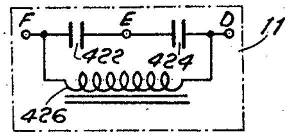
Figure 5:
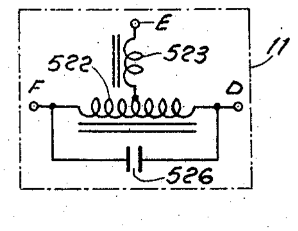

Figs. 3, 4, and 5 show alternative embodiments of the oscillation circuit.

Figure 1:
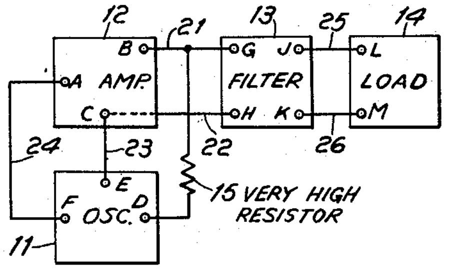
Fig. 1 shows a block diagram of a combined oscillator and amplifier.

Referring to Fig. 1 the unit 12 includes an amplifying device such as a vacuum tube or transistor. An oscillation circuit 11 is used to feed back energy for the amplifying unit 12. The very high resistor 15 is connected between the output terminal B of the amplifying device and terminal D of the oscillation circuit. The input terminal A and reference terminal C of the amplifying device are respectively connected by wires 24 and 23 to terminals F and E of the oscillation circuit. The load impedance includes a filter 13 and a load device 14, with filter 13 connected by wires 21 and 22 between the terminals B and C of the amplifying device 12, and load device 14 connected by wires 25 and 26 to the output of the filter 13.

Fig. 2 shows a preferred embodiment of the oscillation circuit 11, the unit 12 which includes the amplifying device, and the filter 13 in circuit detail. A vacuum-tube triode 210 is used as the amplifying device. The oscillation circuit 11 comprises a miniature low-frequency crystal 226, operating in the parallel mode to give an inductive impedance, in parallel with series condensers 222 and 224. Terminal D at one end of the series condensers is connected through the very high resistor 15 to the output terminal B at the anode of tube 210, terminal F at the other end of the condensers is connected by wire 24 to the input terminal A at the grid of tube 210, and terminal E at an intermediate point, the junction of condensers 222 and 224, is connected by wire 23 to the reference terminal C at the cathode of tube 210.

The filter circuit 13 comprises a condenser 232 and an inductor 233 in parallel, which need not be exactly tuned to the output frequency. Other types of filters may be used. Wire 21 connects the output terminal B of the amplifying device to the input terminal G of the filter, and reference terminal C is connected through bias resistor 218 and plate supply battery 215 to input terminal H of the filter. The load device 14 is connected by wires 25 and 26 to the filter output terminals J and K, respectively. If desired, the output may be taken between a terminal N at a tap of inductor 233 and one of the terminals J or K. Or output may be taken from terminals P and Q of a secondary winding 234. Resistor 15 may be connected to a tap of inductor 233, instead of directly to terminal B.

This circuit may be grounded at a desired point, preferably a terminal of the battery 215. If desired, the battery and ground may be connected in the anode lead of the tube 210. The cathode resistor 218 may be bypassed by a condenser 217.

The crystal 226 is made miniature in size at a low frequency by using a special cut. For example, a crystal may be cut to give a frequency of four kilocycles when used with a condenser 222 of 200 micromicrofarads and a condenser 224 of 160 micromicrofarads. The tube 210 may be one-half of a type 5670, with a grid leak resistor 216 of 2.2 megohms, a grid bias resistor 218 of 470 ohms and a battery 215 of 150 volts. The resistor 15 may have a pure resistance of three megohms. With this circuit, the crystal dissipation is about 30 microwatts, and the output may be 200 volts peak-to-peak when operating into a load 14 having an impedance of 100,000 ohms, the filter 13 having an impedance of about 35,000 ohms.

Fig. 3 shows an alternative embodiment of oscillation circuit 11, in which condenser 224 is replaced by two series condensers 324 and 325 with the terminal D connected to the junction thereof, to further reduce the crystal dissipation. Fig. 4 shows an embodiment with a usual Colpitts oscillation circuit 11 having an inductor 426 in parallel with series condensers 422 and 424.

Fig. 5 shows a possible alternative embodiment, in which an oscillation circuit 11 of the Hartley type comprises a condenser 526 in parallel with an inductor 522. An additional inductor 523 is connected between the terminal E and the center tap of the inductor 522, to cancel the mutual inductance produced between the two sections of inductor 522.

While I have described above the principles of my invention in connection with specific apparatus, it is to be clearly understood that this description is made only by way of example and not as a limitation to the scope of my invention as set forth in the objects thereof and in the accompanying claims.

I claim:

1. In a combination for producing alternating-current power at a given frequency, an amplifying device having input and output terminals and a reference terminal, a direct-current source connected in a circuit between said output and reference terminals for driving current through the amplifying device, load impedance means connected between said output and reference terminals, an oscillation circuit tuned to said given frequency comprising inductive impedance means and capacitive impedance means connected in parallel, one of said impedance means including two parts connected in series with first and second points located in circuit at opposite ends of said series and an intermediate point therebetween, means including a resistor connected between said output terminal and said first point, said resistor having a substantially pure resistive impedance which is very high compared to the impedance of the load impedance means, means connecting said input terminal to said second point, and means connecting said reference terminal to said intermediate point whereby a small part of the output power from the amplifying device is coupled between said first and said intermediate points to excite the oscillation circuit, and an input signal to the amplifying device is obtained from between said second and said intermediate points.

2. A combination according to claim 1, wherein the said amplifying device is a triode vacuum tube having an anode, a grid, and a cathode, connected respectively to the output, input, and reference terminals.

3. A combination according to claim 1, wherein the said inductive impedance is a piezoelectric crystal operating in the parallel mode.

4. A combination according to claim 3, wherein said capacitive means includes a condenser connected between said first point and said crystal.

5. A combination according to claim 1, wherein the said load impedance means comprises a tuned filter followed by a load device.

6. A combination according to claim 5, wherein said filter comprises an inductor and a capacitor in parallel.

7. A combination according to claim 1, wherein said one impedance means includes two condensers connected in series.

8. A combination according to claim 1, wherein said one impedance means includes two inductors connected in series and the means connecting said reference terminal to said intermediate point includes a third inductor which eliminates substantially mutual inductance between said two inductors.

No references cited.